United States Patent [19]

Konno

[11] Patent Number: 4,583,059
[45] Date of Patent: Apr. 15, 1986

[54] ADJUSTABLE FREQUENCY CRYSTAL OSCILLATOR WITH TEMPERATURE COMPENSATION

[75] Inventor: Tetsuro Konno, Tokyo, Japan

[73] Assignee: Seikosha Co., Ltd., Tokyo, Japan

[21] Appl. No.: 454,250

[22] Filed: Dec. 29, 1982

Related U.S. Application Data

[63] Continuation of Ser. No. 188,029, Sep. 17, 1980, abandoned.

[30] Foreign Application Priority Data

Oct. 5, 1979 [JP] Japan .................................. 54-128547
Jan. 10, 1980 [JP] Japan ..................................... 55-1553

[51] Int. Cl.⁴ ......................... H03B 5/32; H03L 1/02
[52] U.S. Cl. ................................. 331/158; 331/176; 331/177 R; 331/179; 310/315
[58] Field of Search .......... 331/116 R, 116 FE, 158, 331/176, 177 R, 66, 179; 368/159; 310/315, 346

[56] References Cited

U.S. PATENT DOCUMENTS 3,568,093 3/1971 Ishida et al. .................. 331/176 X

FOREIGN PATENT DOCUMENTS 2802841 7/1978 Fed. Rep. of Germany ... 331/177 R
54-158839 12/1979 Japan ........................... 331/116 FE
2007450 5/1979 United Kingdom ......... 331/116 FE Primary Examiner—Siegfried H. Grimm
Attorney, Agent, or Firm—Robert E. Burns; Emmanuel J. Lobato; Bruce L. Adams

[57] ABSTRACT

An adjustable frequency crystal oscillator circuit has an adjustment capacitor which is connected in parallel, via a switching circuit, to a load capacitor of a piezoelectric vibrator. The oscillation frequency is controlled by varying the duty factor of the pulses applied to the switching circuit for switching the adjustment capacitor into and out of parallel connection with the load capacitor. The frequency-temperature characteristic is compensated for by varying the duty factor according to changes in temperature. No trimmer capacitor is needed, and the frequency-temperature characteristic is effectively compensated for over a wide temperature range.

11 Claims, 12 Drawing Figures

SWITCHING CIRCUIT

ADJUSTABLE FREQUENCY CRYSTAL OSCILLATOR WITH TEMPERATURE COMPENSATION

This is a continuation of application Ser. No. 188,029, filed Sept. 17, 1980 and now abandoned.

BACKGROUND OF THE INVENTION

The present invention relates to an oscillator with a piezoelectric vibrator, in which it is easy to control the oscillation frequency, and in which the oscillation frequency is kept constant over a wide temperature range.

For example, in a crystal oscillator, a trimmer capacitor is needed to control the oscillation frequency, so its construction becomes complex. And the oscillation frequency drifts according to the temperature, so it can be used only in a narrow temperature range. Even in an oscillator having the lowest frequency drift rate, its oscillation frequency drifts about ±2 PPM in the temperature range 5~35° C., and at temperatures outside of that temperature range the oscillation frequency drifts extremely.

SUMMARY OF THE INVENTION

A first object of the present invention is to provide an oscillator having an easily controlled oscillation frequency, without a trimmer capacitor.

A second object of the present invention is to provide an oscillator having a very stable oscillation frequency, in spite of switching the switching circuit for connecting and cutting off a capacitance to a load capacitance.

A third object of the present invention is to provide an oscillator having an oscillation frequency compensated over a wide temperature range, and for which most of its structure can be integrated in a C-MOS IC chip.

DESCRIPTION OF THE PREFERRED EMBODIMENTS

Figure 1:
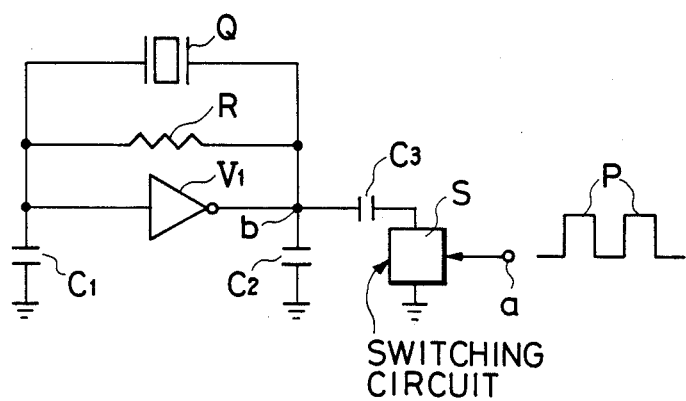
FIG. 1 shows an electric circuit for explaining the principle of the present invention.

An embodiment of the present invention is described below with reference to the drawings. Referring to FIG. 1, a feedback resistance R, a C-MOS inverter $V_1$ and load capacitances $C_1$, $C_2$ are connected to a quartz vibrator Q. A capacitance $C_3$ is connected in parallel to a load capacitance $C_2$, and a switching circuit S is connected in series to capacitance $C_3$.

In the aforementioned construction, the connection of the capacitance $C_3$ to the load capacitance $C_2$ is controlled by supplying the pulses P to a terminal a of switching circuit S.

Figure 2:
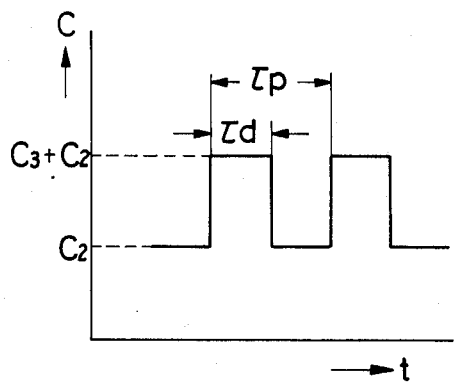
FIG. 2 is a graph showing load capacitance seen from terminal b in FIG. 1 by switching the switching circuit.

The capacitance C seen from the terminal b is represented in FIG. 2, and the effective load capacitor seen from the terminal b is varied by changing the duty factor $\tau d/\tau p$ of pulses P. Accordingly, the oscillation frequency can be adjusted.

Next, it is described below how the effective load capacitor C(t), seen from the terminal b, varies according to the duty factor of the pulses P.

The capacitor C(t) is expanded as the Fourier series, as follows.

$$C(t) = a_0 + a_1 \cos \omega p \cdot t + a_2 \cos \omega p \cdot t + \ldots + b_1 \sin \omega p \cdot t + b_2 \sin \omega p \cdot t + \ldots$$

Provided that, $$\omega p = 2\pi fp, \quad fp = 1/\tau p$$

$$a_0 = 1/\tau p \int_0^{\tau p} C(t) dt$$

$$a_n = 2/\tau p \int_0^{\tau p} C(t) \cos n\omega p \cdot t \, dt$$

$$b_n = 2/\tau p \int_0^{\tau p} C(t) \sin n\omega p \cdot t \, dt$$

Consequently, capacitor C(t) is formulated below.

$$C(t) = C_2 + C_3 \left( \tau d/\tau p + \sum_{n=1}^{\infty} 1/n\pi \cdot \sin n\omega p \tau d \cdot \cos n\omega p \cdot t + \sum_{n=1}^{\infty} 1/n\pi (1 - \cos n\omega p \cdot \tau d) \cdot \sin n\omega p \cdot t \right) \quad (1)$$

$$= C_2 + C_3 \left( \tau d/\tau p + \sum_{n=1}^{\infty} 1/n\pi \cdot 2(1 - \cos 2n\pi \tau d/\tau p) \cdot \sin(2n\pi t/\tau p + \tan^{-1} \frac{\sin 2n\pi \tau d/\tau p}{1 - \cos 2n\pi \tau d/\tau p}) \right)$$

The above formula (1) contains the switching frequency $n \cdot fp (n=1, 2, 3 ---)$, and the response of the quartz oscillator to said switching frequency is explained as follows.

The time constant $\tau c$ of the passive elements of the oscillator is formulated as follows.

$$\tau c \fallingdotseq 2Q/\omega_0$$

(Q: Q value of the quartz resonator, $\omega_0 = 2\pi f_0$, $f_0$: oscillation frequency)

Accordingly, by predetermining the frequency fp of the switching pulses P to be extremely higher than $1/\tau c (fp > > 1/\tau c)$, the frequency fp is negligible in the oscillation frequency spectrum of the quartz oscillator. Therefore, in the formula (1), the terms containing $n \cdot fp(fp = 1/\tau p)$ are negligible. Consequently, the load capacitor is formulated as $C(t) = C_2 + C_3 \cdot \tau d/\tau p$, namely, the effective load capacitor is decided only by the duty factor of the pulses P. So, the oscillation frequency is controlled by the duty factor of the pulses P.

For example, when a quartz oscillator having an oscillation frequency of about 4.2 MHz and Q value of about $3 \times 10^5$ to $5 \times 10^5$ is used, by predetermining the frequency fp of pulses P to about 10 KHz, the oscillation frequency is not influenced by the above frequency fp, but the oscillation frequency is controlled by the duty factor of the pulses P.

Accordingly, the oscillation frequency can be adjusted by the duty factor of the pulses, without losing the stability of the oscillation frequency.

Figure 3:
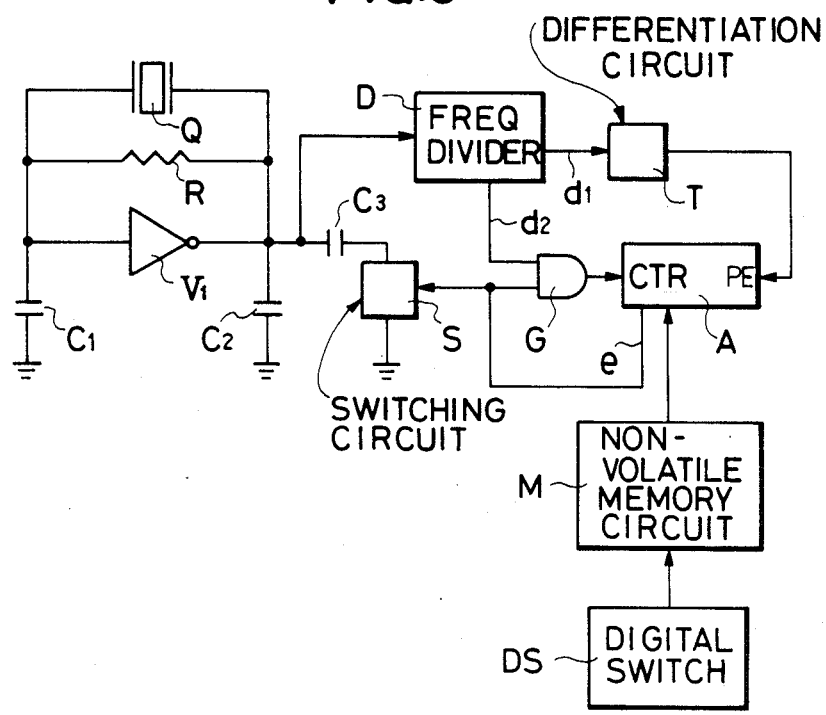
FIG. 3 is a block diagram showing an electric circuit according to an embodiment of the present invention.

In FIG. 3, circuit structure to set the duty factor of pulses P is illustrated. A frequency divider D divides the oscillation frequency, and the output frequencies from the terminals $d_1$, $d_2$ are $\frac{1}{2}^n$, $\frac{1}{2}^m (n > m)$ of the oscillation frequency, respectively. A differentiation circuit T differentiates the output frequency from the terminal $d_1$, and the output pulses from the differentiation circuit T are supplied to the input terminal PE of a $K(K = n - m)$ bits presettable-down counter A. A gate circuit G receives the pulses from the terminal e, and the pulses from the terminal $d_2$ pass through the gate circuit G. The desired value of K is set by a digital switch DS, and it is memorized in a non-volatile memory circuit M.

The operation of the above circuits is described below. By the pulse from the differentiation circuit, the desired value memorized in the memory circuit M is preset in the down counter A. Therefore, the terminal e turns to a logic value "1" (hereinafter simply referred to a logic "1"), so the pulses from the terminal $d_2$ pass through the gate circuit G, and they are supplied to the down counter A. And, the terminal e turns to a logic "0", when the down counter A counts the desired value. Then, the content of the memory circuit M is preset again in the down counter A by a next pulse from the terminal $d_1$, and the abovementioned operation repeats again.

Consequently, from the terminal $d_1$, the pulses having a duty factor corresponding to the value set by the digital switch DS are generated and switch the switching circuit S. Consequently the effective load capacitor and the oscillation frequency are adjusted.

In FIG. 3, the construction except the digital switch DS, capacitances $C_1$, $C_2$, $C_3$ and the quartz vibrator can be integrated, and a trimmer capacitor is not needed, so the stability of the oscillation frequency improves.

Figure 4:
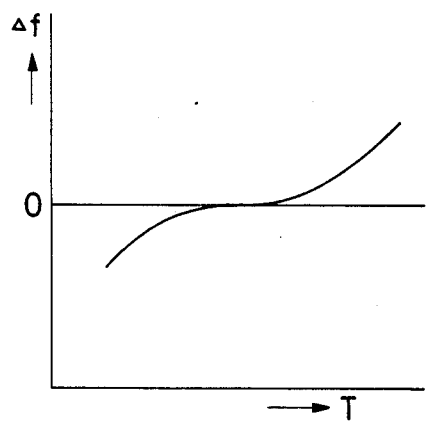
FIG. 4 is a frequency-temperature characteristic diagram of a piezoelectric vibrator in FIG. 3.

Next, an embodiment of the temperature compensation circuit is explained below, using an AT cut quartz resonator having a frequency-temperature characteristic which is represented as a cubic curve shown in FIG. 4. In FIG. 4, a frequency difference $\Delta f$ between the objective frequency $f_0$ and an actual frequency f is shown on the vertical axis, and the temperature is shown on the horizontal axis.

Figure 5:
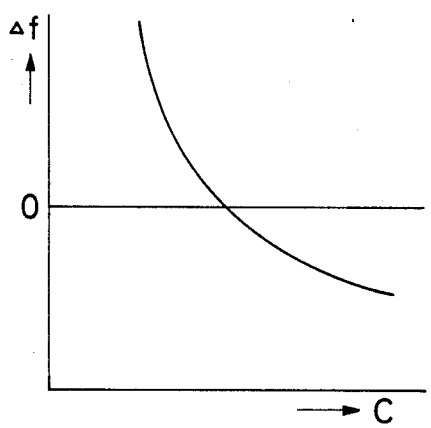
FIG. 5 is a frequency-load capacitance characteristic diagram of a piezoelectric vibrator in FIG. 3.

On the other hand, a frequency-load capacitor characteristic is represented as a curve in FIG. 5, so the frequency drift according to the temperature can be compensated by controlling the load capacitor.

Figure 6:
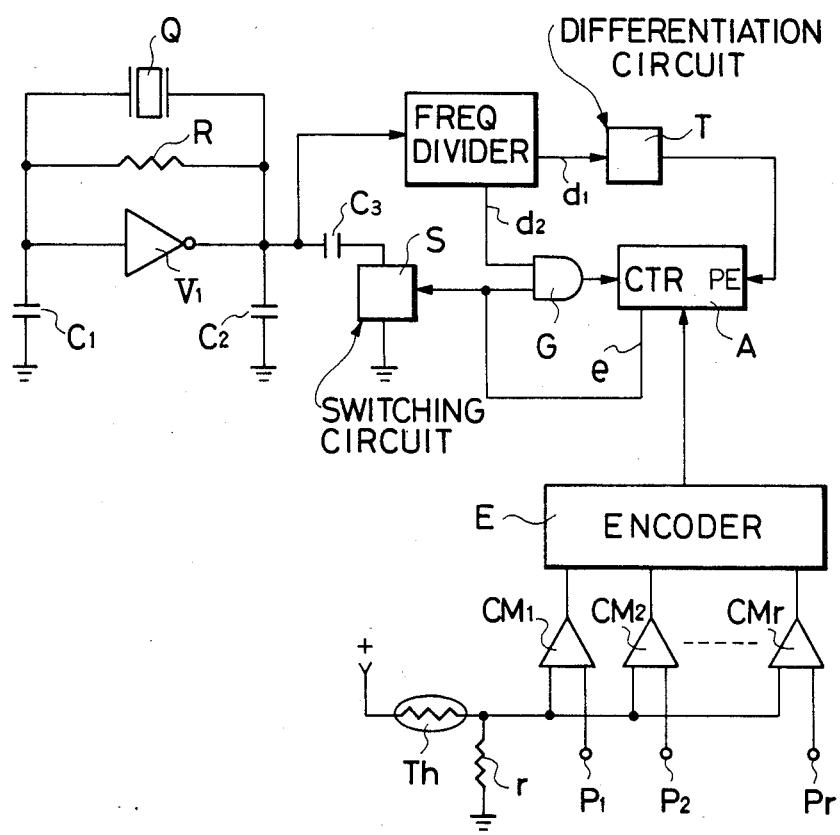
FIG. 6 is a block diagram showing an electric circuit for the temperature compensation according to an embodiment of the present invention.

In FIG. 6, the temperature is converted to voltage by a thermistor Th and a resistance r, and the voltage is supplied to comparison circuits $CM_1$ - - - $CM_r$. The terminals $P_1$ - - - $P_r$ of the comparison circuits $CM_1$ - - - $CM_r$ are connected to respective different predetermined voltages. The outputs from the comparison circuits $CM_1$ - - - $CM_r$ are converted to binary coded data by an encoder E, and the data is supplied to the down counter A.

Figure 7:
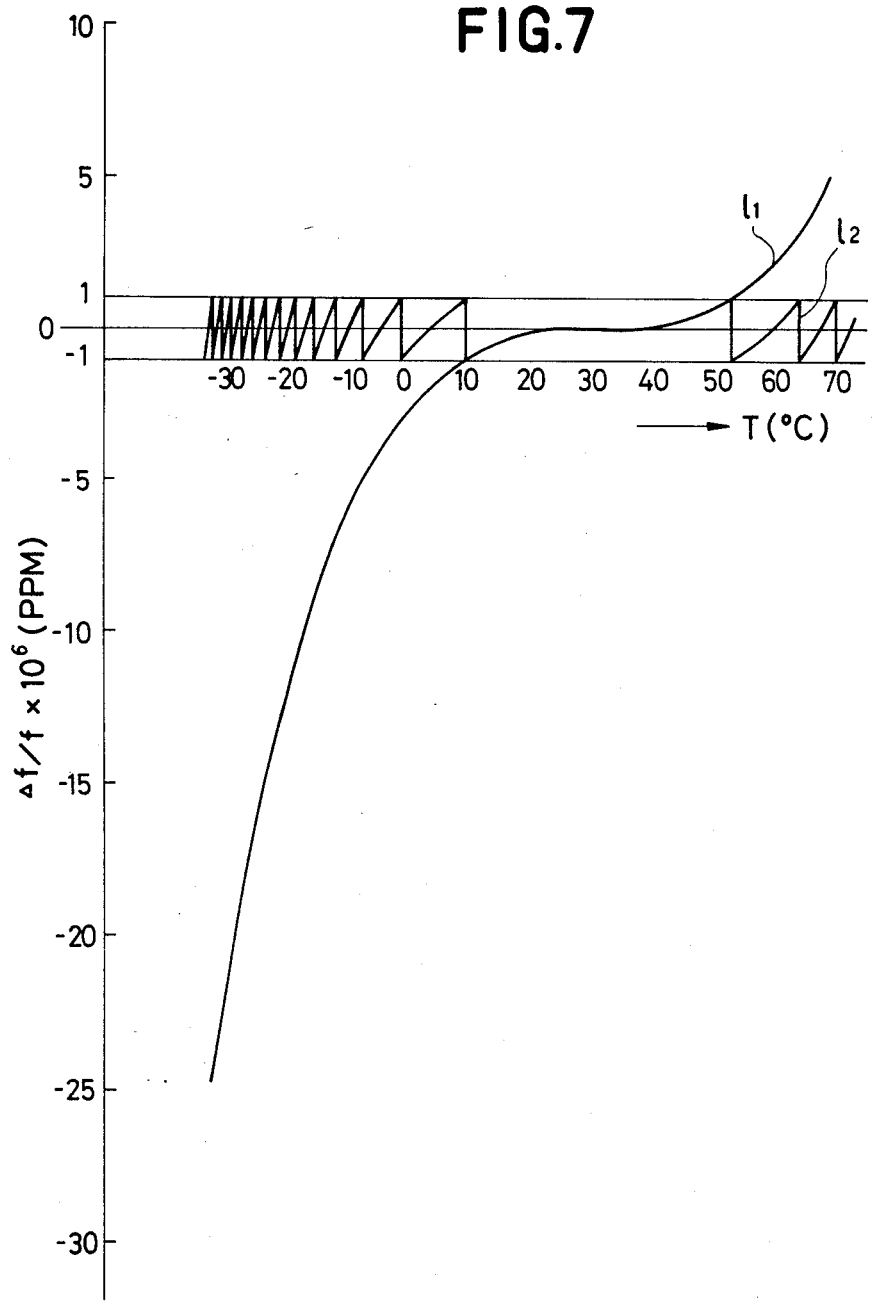
FIG. 7 is a frequency-temperature characteristic diagram before and after the compensation by the electric circuit in FIG. 6.

Consequently, the data corresponding to the temperature is preset in the down counter A, namely, the duty factor of pulses for switching the switching circuit S is set. Therefore, the switching of the switching circuit is controlled corresponding to the temperature, and the effective load capacitor is controlled, accordingly, the oscillation frequency is compensated. The frequency-temperature characteristic in the non-compensated condition is shown in FIG. 7 as a curve $l_1$, and it is compensated to a wave-like line $l_2$ by the above mentioned compensation. Accordingly, the frequency drifting rate $\Delta f/f$ can be controlled under $\pm 1$ PPM in a very wide temperature range.

Figure 8:
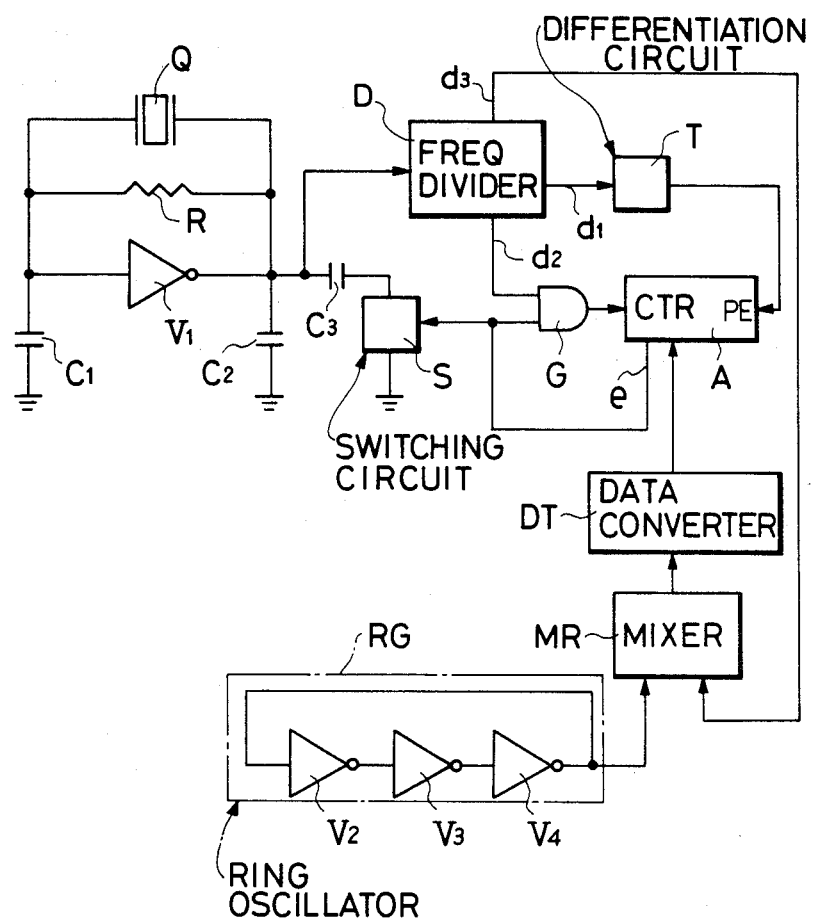
FIG. 8 is a block diagram showing an electric circuit according to another embodiment of the present invention.
Figure 9:
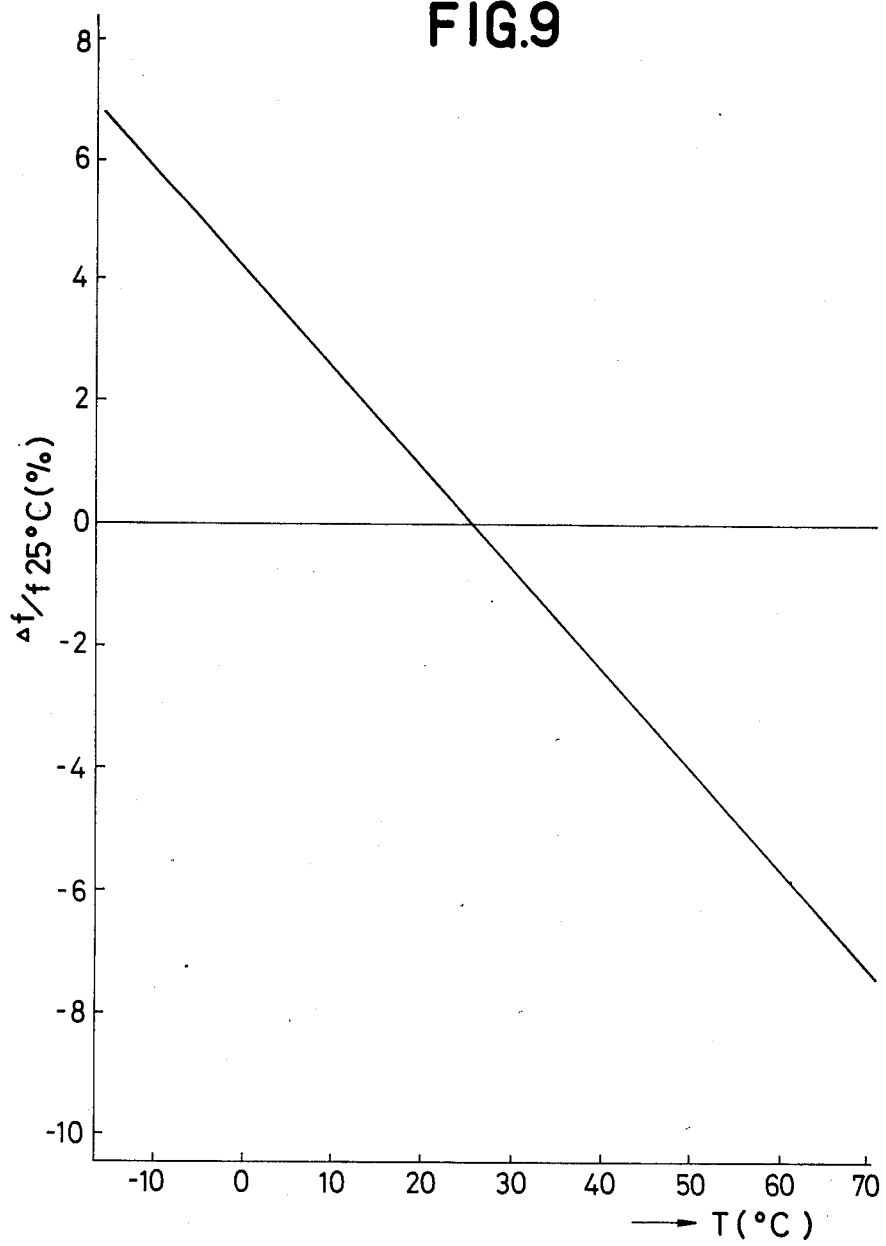
FIG. 9 is a frequency-temperature characteristic diagram of a ring oscillator in FIG. 8.

Next, referring to FIG. 8, another embodiment for the temperature compensation circuit is explained below. A ring oscillator RG is composed of C-MOS inverters $V_2$, $V_3$, $V_4$, and its output frequency is supplied to a mixer MR. A difference frequency between the output frequency of the ring oscillator RG and the frequency from a terminal $d_3$ is supplied to the data converter DT. The frequency-temperature characteristic of the ring oscillator is nearly linear as shown in FIG. 9. At the vertical axis in FIG. 9, the frequency drifting rate $\Delta f/f_{25^\circ C.}$ ($f_{25^\circ C.}$: oscillation frequency at 25° C., $\Delta f = f_{T^\circ C.} - f_{25^\circ C.}$, $f_{T^\circ C.}$: oscillation frequency at T° C.) is shown.

As the oscillation frequency of the ring oscillator RG drifts linearly according to the temperature, the output frequency from the mixer MR varies according to the temperature. And it is converted to binary coded data by the data converter DT, and the data is supplied to the down counter A.

Consequently, the oscillation frequency of the quartz vibrator Q is compensated as shown in FIG. 7. And the construction except the quartz vibrator Q and the capacitances $C_1$, $C_2$, $C_3$ can be integrated in a C-MOS IC chip.

Figure 10:
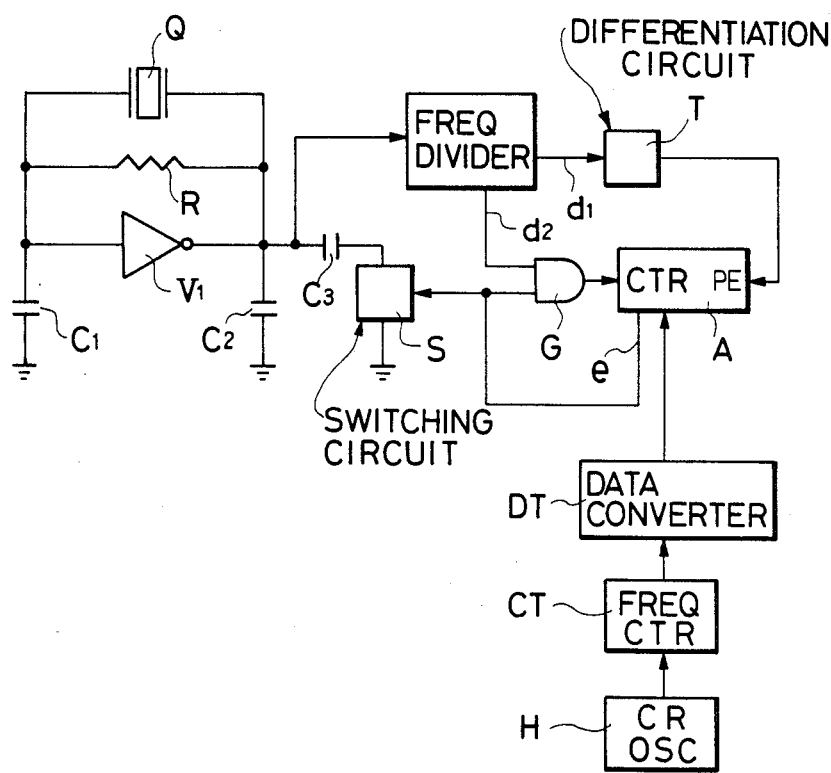
FIG. 10 is a block diagram showing an electric circuit according to a further embodiment of the present invention.

Further, another embodiment is shown in FIG. 10. The oscillation frequency of a CR (capacitor-resistor) oscillator H which has a thermistor, is counted by a frequency counting circuit CT, and its content is converted to binary coded data by the data converter DT. The oscillation frequency of the CR oscillator H drifts according to the temperature, so the data from the data converter varies according to the temperature.

Figure 11:
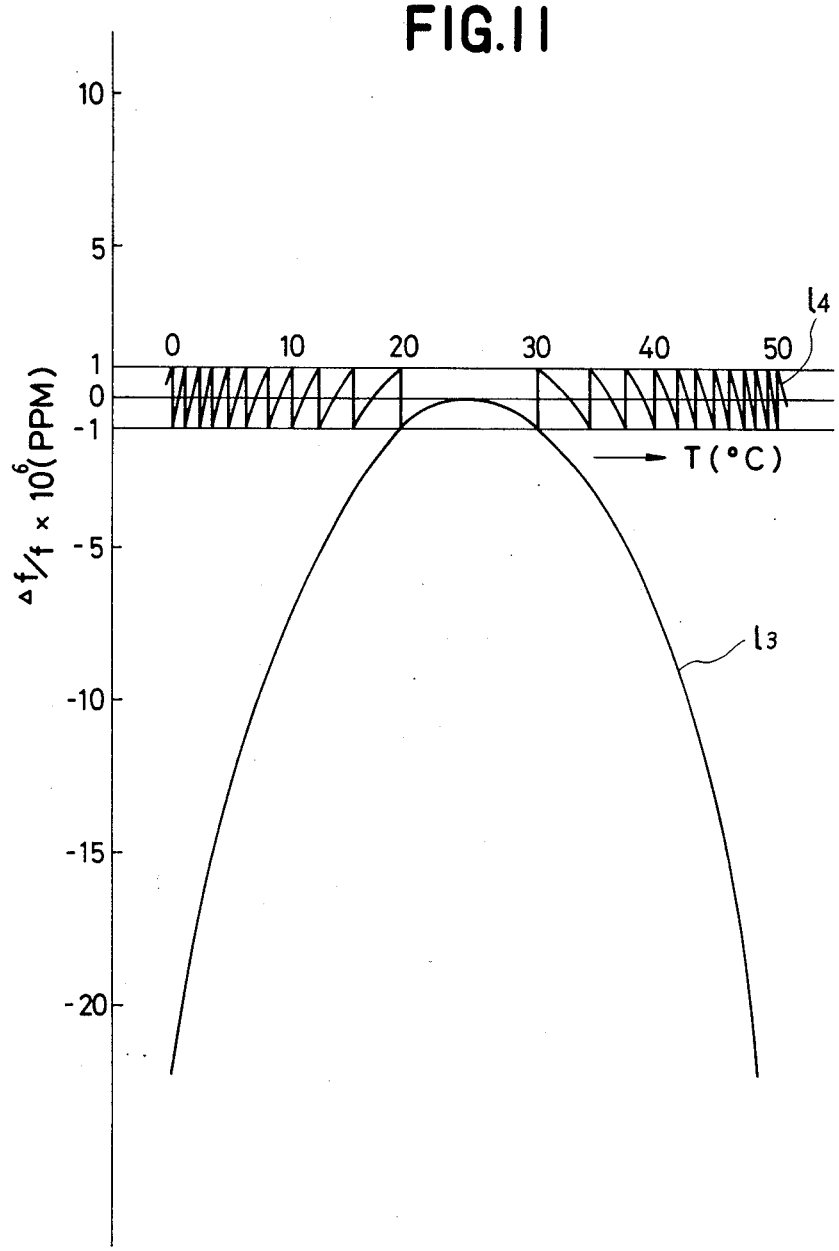
FIG. 11 is a frequency-temperature characteristic diagram of another piezoelectric vibrator before and after the compensation; and, FIG. 12 is a block diagram showing an electric circuit according to an embodiment of the present invention for the compensation in FIG. 11.

Next, an embodiment is explained below, using a quartz vibrator having a frequency-temperature characteristic which is represented as a quadric curve $l_3$ in FIG. 11.

Figure 12:
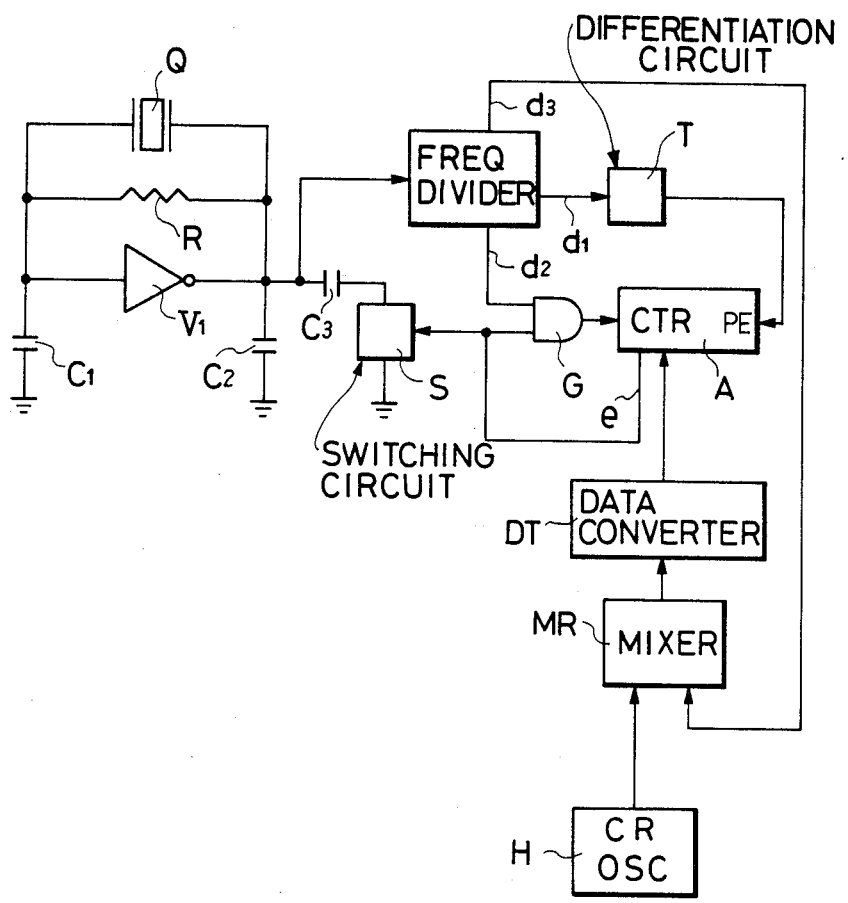

Referring to FIG. 12, the oscillation frequency of the CR oscillator H and the output frequency from the terminal $d_3$ are supplied to the mixer MR, and the difference frequency is converted to binary coded data by the data converter DT. The oscillation frequency of the CR oscillator H is predetermined to be coincident with the frequency from the terminal d₃ at 25° C., namely at the center line of the quadric curve l₃ in FIG. 11. Therefore, the difference frequency from the mixer MR is 0 at 25° C. and drifts symmetrically according to the increase and decrease of the temperature. Consequently, the frequency-temperature characteristic shown as the quadric curve l₃ in FIG. 11 can be compensated under ±1 PPM in a very wide temperature range, showing as a wave-like line l₄.

According to the present invention as described above, the parallel connection between a capacitance and a load capacitance is controlled by the switching pulses which have a variable duty factor. Therefore, the oscillation frequency can be adjusted by controlling the duty factor of the switching pulses, a trimmer capacitor is not needed, and the frequency stability improves.

Further, since the switching pulses are generated from a frequency divider which divides the oscillation frequency, the oscillation frequency and the switching pulses are not influenced by aging.

In addition, since the duty factor of the switching pulses is varied according to the temperature, the oscillation frequency can be compensated and can be kept stable over a wide range of temperature.

What we claim is:

1. An adjustable frequency crystal oscillator circuit, comprising:
    a vibrator circuit comprised of a piezoelectric vibrator and a load capacitor connected to said piezoelectric vibrator;
    a second capacitor for connection to said load capacitor of said vibrator circuit;
    a switching circuit controllable for connecting and disconnecting said second capacitor to said load capacitor in response to an electrical signal applied thereto;
    a frequency divider circuit connected to receive the output signal from said vibrator circuit for generating a first output signal having a period substantially shorter than the time constant of said piezoelectric vibrator and for generating a second output signal having a frequency substantially higher than the frequency of the first output signal;
    a presettable down counter circuit for generating an output electrical signal when the content of said down counter circuit is non-zero and having means responsive to the first output signal for enabling presetting of the content thereof;
    presetting means coacting with the first output signal for repetitively presetting the content of said down counter circuit at a period equal to the period of the first output signal;
    means for applying the output electrical signal from said down counter circuit to said switching circuit for enabling said switching circuit to connect said second capacitor to said load capacitor during the time that the content of said down counter circuit is non-zero; and
    means for applying said second output signal to said down counter circuit during the time that the content of said down counter circuit is non-zero, whereby the duty cycle of the counter circuit output signal is determined by the content of said down counter circuit initially set by said presetting means.

2. An adjustable frequency crystal oscillator circuit according to claim 1, wherein said presetting means is adjustable for selecting the value to which the content of said down counter circuit is preset by said presetting means.

3. An adjustable frequency crystal oscillator circuit according to claim 2, wherein said presetting means comprises means responsive to temperature for presetting the value to which the content of said down counter circuit is preset to a value corresponding to the temperature.

4. An adjustable frequency crystal oscillator circuit according to claim 1, wherein said presetting means is comprised of a circuit element responsive to temperature; biasing means for electrically biasing said circuit element to develop an electrical signal having a value representative of temperature; a comparator circuit receptive of the electrical signal representative of temperature for developing an output signal having a value corresponding to the temperature represented by the electrical signal developed by said circuit element; and encoding means for encoding the comparator circuit output signal and for setting the encoded signal in said down counter circuit.

5. An adjustable frequency crystal oscillator circuit according to claim 1, wherein said presetting means is comprised of means for generating a reference frequency signal; an oscillator circuit responsive to temperature for generating an output signal having a frequency dependent on temperature; a mixer circuit connected to receive the reference frequency signal and the oscillator circuit output signal for generating a difference frequency signal having a value determined by the temperature of said oscillator circuit; and encoding means for encoding the mixer circuit output signal and for setting the encoded signal in said down counter circuit.

6. An adjustable frequency crystal oscillator circuit according to claim 1, wherein said presetting means is comprised of an oscillator circuit responsive to temperature for generating an output signal having a frequency dependent on temperature; a frequency counter circuit receptive of the oscillator circuit output signal for determining the frequency of the oscillator circuit output signal and for generating an output signal representative of temperature; and encoding means for encoding the frequency counter circuit output signal and for setting the encoded signal in said down counter circuit.

7. An adjustable frequency crystal oscillator circuit, comprising:
    a vibrator circuit comprising a piezoelectric vibrator and a load capacitor connected to said piezoelectric vibrator;
    a second capacitor for connection in parallel with said load capacitor of said vibrator circuit;
    a switching circuit controllable for connecting and disconnecting said second capacitor to said load capacitor in response to electrical pulses applied thereto; and
    a pulse generator for generating pulses having a variable duty factor and for applying the pulses to switch said switching circuit, said pulse generator generating pulses having a period which is substantially shorter than the time constant $\tau c$ of said piezoelectric vibrator, where
    $\tau c = 2Q/w0$, $Q$ is the $Q$ value of said piezoelectric vibrator, $w0 = 2\pi f0$, and $f0$ is the oscillation frequency of said vibrator circuit.

8. An adjustable frequency crystal oscillator circuit as set forth in claim 7, in which said pulse generator comprises:
  a frequency divider for dividing the oscillating output signal of said vibrator circuit; and
  control circuit means for controlling the pulse width of the pulses from said frequency divider to switch said switching circuit at controlled intervals of time.

9. A temperature compensated crystal oscillator circuit, comprising:
  a vibrator circuit comprising a piezoelectric vibrator and a load capacitor connected to said piezoelectric vibrator;
  a second capacitor for connection in parallel with said load capacitor of said vibrator circuit;
  a switching circuit controllable for connecting and disconnecting said second capacitor to said load capacitor in response to electrical pulses applied thereto; and
  a pulse generator for generating pulses having a duty factor which varies according to the ambient temperature and for applying the pulses to switch said switching circuit, said pulse generator generating pulses having a period which is substantially shorter than the time constant $\tau c$ of said piezoelectric vibrator where $\tau c \fallingdotseq 2Q/w0$, Q is the Q value of said piezoelectric vibrator, $w0 = 2\pi f0$ and $f0$ is the oscillation frequency.

10. A temperature compensated crystal oscillator circuit as set forth in claim 9, in which said pulse generator comprises:
  a ring oscillator comprised of an odd number of C-MOS inverters connected in a circle for generating an oscillating output signal having a frequency which varies with temperature change;
  a frequency divider for dividing the oscillating output signal of said vibrator circuit; and
  control circuit means responsive to the frequency of the ring oscillator output signal for controlling the pulse width of the pulses from said frequency divider according to the temperature to switch said switching circuit to maintain the frequency of the crystal oscillator circuit constant.

11. A temperature compensated crystal oscillator circuit as set forth in claim 9, in which said pulse generator comprises:
  a capacitor-resistor oscillator with a thermistor for varying its oscillation frequency according to the ambient temperature;
  a frequency divider for dividing the oscillating output signal of said vibrator circuit; and
  control circuit means responsive to the frequency of the capacitor-resistor oscillator output signal for controlling the pulse width of the pulses from said frequency divider according to the temperature to switch said switching circuit to maintain the frequency of the crystal oscillator circuit constant.

* * * * *